US008553195B2

(12) United States Patent
Nakagawa

(10) Patent No.: US 8,553,195 B2
(45) Date of Patent: Oct. 8, 2013

(54) SUBSTRATE FOR A DISPLAY PANEL, A DISPLAY PANEL HAVING THE SUBSTRATE, A METHOD OF PRODUCING THE SUBSTRATE, AND A METHOD OF PRODUCING THE DISPLAY PANEL

(75) Inventor: Hidetoshi Nakagawa, Tsu (JP)

(73) Assignee: Sharp Kabushiki Kaisha, Osaka (JP)

( * ) Notice: Subject to any disclaimer, the term of this patent is extended or adjusted under 35 U.S.C. 154(b) by 1060 days.

(21) Appl. No.: 12/296,072

(22) PCT Filed: Feb. 2, 2007

(86) PCT No.: PCT/JP2007/051775
§ 371 (c)(1),
(2), (4) Date: Dec. 17, 2008

(87) PCT Pub. No.: WO2007/113941
PCT Pub. Date: Oct. 11, 2007

(65) Prior Publication Data
US 2009/0283767 A1    Nov. 19, 2009

(30) Foreign Application Priority Data

Apr. 5, 2006    (JP) ................................. 2006-104464

(51) Int. Cl.
*G02F 1/1333*    (2006.01)

(52) U.S. Cl.
USPC .......................................... 349/160; 349/158

(58) Field of Classification Search
USPC ............................................... 349/4, 158–160
See application file for complete search history.

(56) References Cited

U.S. PATENT DOCUMENTS

| 6,030,265 | A  | * | 2/2000 | Inada .............................. 445/24 |
| 6,504,581 | B1 | * | 1/2003 | Hirosue et al. .................... 349/4 |

FOREIGN PATENT DOCUMENTS

| JP | 10-214770 A  |   | 8/1998  |
| JP | 2000-231184 A |   | 8/2000  |
| JP | 2003-43939   | * | 2/2003  |
| JP | 2003-344872 A |   | 12/2003 |

* cited by examiner

*Primary Examiner* — Dung Nguyen

(74) *Attorney, Agent, or Firm* — Birch, Stewart, Kolasch & Birch, LLP

(57) ABSTRACT

A substrate for a display panel by which a boundary position of divided exposure regions of elements formed by divisional exposure can be easily identified and process management and evaluation can be easily performed, a display panel having the substrate, a method of producing the substrate, and a method of producing the display panel. A substrate 11 for a display panel includes two or more thin film patterns formed by divisional exposure by which a region to be exposed is divided into a plurality of exposure regions and exposure is made on each of the divided exposure regions, wherein boundary positions of the divided exposure regions of the two or more thin film patterns do not coincide with each other, and a marking 3 indicating the boundary position of the divided exposure regions of at least one of the two or more thin film patterns.

9 Claims, 10 Drawing Sheets

Enlarged view of Portion A

Enlarged view of Portion B

Enlarged view of Portion A

Enlarged view of Portion A

SUBSTRATE FOR A DISPLAY PANEL, A DISPLAY PANEL HAVING THE SUBSTRATE, A METHOD OF PRODUCING THE SUBSTRATE, AND A METHOD OF PRODUCING THE DISPLAY PANEL

BACKGROUND OF THE INVENTION

1. Field of the Invention

The present invention relates to a substrate for a display panel, a display panel having the substrate, a method of producing the substrate, and a method of producing the display panel. The present invention specifically relates to a substrate for a display panel produced by a production method including a step of forming a photoresist pattern of a given shape by divisional exposure, a display panel having the substrate, a method of producing the substrate, and a method of producing the display panel.

2. Description of the Related Art

A generally used liquid crystal display panel has two substrates which are placed opposed to each other having a minute gap therebetween, and liquid crystals are sealed in between the substrates. On one of the substrates, pixel electrodes are arranged in a matrix, and elements such as thin film transistors arranged to apply voltages to the pixel electrodes, data signal lines (source signal lines) and scanning signal lines (gate signal lines) are provided. On the other substrate, elements such as a black matrix and color layers of red, green and blue colors are arranged in a matrix, and elements such as transparent electrodes (common electrodes) are provided on those elements.

Some of the above-mentioned elements are formed by photolithography. For example, the thin film transistors, the black matrix, and the color layers are preferably formed by steps of coating a photoresist material on the substrate, performing exposure on the coated photoresist material via a photomask, and removing unnecessary portions of the photoresist material.

In the step of performing exposure on the coated photoresist material via the photomask, the divisional exposure is preferably used. The divisional exposure is performed by arbitrarily designating a specific pattern or range in a pattern formed on the photomask, dividing a region to be exposed into some regions, and performing exposure on the divided regions while performing screen composition of a product pattern on the substrate. Owing to such divisional exposure, it is possible to perform exposure on a large area region to be exposed with a small area photomask. Thus, the cost of the photomask can be decreased.

However, in such divisional exposure, if the display panel does not fall within one photomask, there is no other choice but to set the boundary between the divided regions (hereinafter, referred to as "divided exposure regions") within a display region of the display panel. In addition, if there is a deviation between the divided exposure regions for some reasons, the patterns, which should be ordinarily formed continuously over the entire display region of the display panel, become discontinuous at the boundary between the divided exposure regions.

When the exposure deviation becomes great, the following problems could arise. If the patterns of the elements formed within the display region are discontinuous at the boundary between the divided exposure regions, positional relations between the elements provided on one of the substrates and the elements provided on the other substrate differ with each divided exposure region when the two substrates are opposed and bonded to each other. Therefore, display properties of liquid crystals could differ with each divided exposure region. In addition, properties of the elements provided on the substrate could differ with each divided exposure region. In addition, these differences could be visually observed as streaky luminance differences or color irregularities at the boundary between the divided exposure regions.

Therefore, in order to produce a liquid crystal display panel excellent in display quality, it is necessary to make inspection for the luminance differences or color irregularities caused by the exposure deviation after production of the liquid crystal display panel. If the exposure deviation is detected by the inspection, it is necessary to grasp occurrence trend and make process management and evaluation.

As a prior art literature relating to the present invention, Japanese Patent Application Unexamined Publication No. 2000-231184 is cited.

There are a plurality of elements to be formed by the divisional exposure. Therefore, in order to make process management and evaluation, it is necessary to specify of which element the boundary between the divided exposure regions where the luminance differences or color irregularities detected by the inspection occur is.

However, if the boundary between the divided exposure regions of one element coincides with the boundary between the divided exposure regions of the other element, it becomes difficult to specify of which element the boundary between the divided exposure regions where the streaky luminance differences or color irregularities detected by the inspection occur is. Thus, process management and evaluation become also difficult.

In addition, even if the boundary between the divided exposure regions of one element does not coincide with the boundary of the divided exposure regions of the other element, it is first necessary to grasp where the boundary between the divided exposure regions of each element is positioned on the substrate. In other words, if streaky luminance differences or color irregularities are detected by the inspection in a producing step, it is necessary to check the occurrence position of the streaky luminance differences or color irregularities by making measurement on the display panel by means of a measure, and check against a design drawing to specify of which element the boundary between the divided exposure regions where the luminance differences or color irregularities detected by the inspection occur is. Thus, much effort is required in making the inspection.

In addition, it is necessary to check whether streaky luminance differences or color irregularities are occurring at the boundary between the divided exposure regions of each element at the time of checking quality of produced display panels. In such a situation, it is necessary to make measurement on the display panel by means of a measure in order to grasp where the boundary between the divided exposure regions of each element is positioned. Thus, much effort is required in checking quality of the display panel.

SUMMARY OF THE INVENTION

An object of the invention is to overcome the problems described above and to provide a substrate for a display panel in which a given pattern is formed by divisional exposure and by which process management and evaluation can be easily performed, a display panel having the substrate, a method of producing the substrate, and a method of producing the display panel. Another object of the invention is to provide a substrate for a display panel in which a plurality of patterns are formed by divisional exposure and a boundary position of divided exposure regions of each pattern can be easily identified, a display panel having the substrate, a method of producing the substrate, and a method of producing the display panel. Another object of the invention is to provide a substrate for a display panel by which quality of a display panel can be easily checked, a display panel having the substrate, a method of producing the substrate, and a method of producing the display panel.

In order to overcome the problems described above, preferred embodiments of the present invention provide a substrate for a display panel including a thin film pattern formed by divisional exposure by which a region to be exposed is divided into a plurality of exposure regions and exposure is made on each of the divided exposure regions, and a marking indicating a boundary position of the divided exposure regions.

In addition, preferred embodiments of the present invention provide a substrate for a display panel including two or more thin film patterns formed by divisional exposure by which a region to be exposed is divided into a plurality of exposure regions and exposure is made on each of the divided exposure regions, wherein boundary positions of the divided exposure regions of the two or more thin film patterns do not coincide with each other, and a marking indicating the boundary position of the divided exposure regions of at least one of the two or more thin film patterns.

It is preferable that the marking is provided at a boundary between the divided exposure regions and/or in the vicinity of the boundary.

Additionally, it is preferable that the marking is provided in a light shielding thin film pattern which is provided in the vicinity of an outer rim of the thin film pattern formed by the divisional exposure.

Additionally, it is preferable that the marking is made of a material which is the same as a material of any one of the two or more thin film patterns formed by the divisional exposure. The thin film patterns define one of thin film transistors, a black matrix and a color filter are preferably used.

A display panel is prepared by using such a substrate for a display panel.

Preferred embodiments of the present invention also provide a production method of a substrate for a display panel or a display panel including the steps of forming a marking indicating a boundary position of divided exposure regions of a thin film pattern formed by divisional exposure by which a region to be exposed is divided into a plurality of exposure regions and exposure is made on each of the divided exposure regions, and identifying the boundary position of the divided exposure regions based on the marking.

Preferred embodiments of the present invention also provide a production method of a substrate for a display panel or a display panel including the steps of forming a marking indicating a boundary position of divided exposure regions of at least one of two or more thin film patterns formed by divisional exposure by which a region to be exposed is divided into a plurality of exposure regions and exposure is made on each of the divided exposure regions, wherein boundary positions of the divided exposure regions of the two or more thin film patterns do not coincide with each other, and identifying the boundary position of the two or more divided exposure regions based on the marking.

According to the preferred embodiments of the present invention, providing the marking allows easily identifying the boundary position of the divided exposure regions of the thin film pattern formed on the substrate. Thus, process management and evaluation or checking of quality of the display panel can be easily performed. In addition, providing the marking indicating the boundary position of the divided exposure regions of at least one of the two or more thin film patterns allows easily distinguishing between the boundary positions of the divided exposure regions of the respective thin film patterns. Thus, process management and evaluation or checking of quality of the display panel can be easily performed.

Providing the marking at the boundary between the divided exposure regions and/or in the vicinity of the boundary allows more easily identifying the boundary position of the divided exposure regions of the thin film pattern.

Providing the marking in the light shielding pattern provided in the vicinity of the outer rim of the thin film pattern does not affect the function of the display panel.

In addition, forming the marking by using the material which is the same as the material of any one of the two or more thin film patterns formed by the divisional exposure allows providing the marking without increasing the number of steps of producing the substrate.

Other features, elements, characteristics and advantages of the present invention will become more apparent from the following detailed description of preferred embodiments with reference to the attached drawings.

BRIEF DESCRIPTION OF THE DRAWINGS

FIG. 1A is a partial sectional view showing an overall structure of the display panel. FIG. 1B is a sectional view showing a part of a cross sectional structure of the display panel as viewed in the direction of the arrows A of FIG. 1A.

FIG. 4A shows an irradiation amount when light energy is irradiated onto one of the divided exposure regions. FIG. 4B shows an irradiation amount when light energy is irradiated onto the other divided exposure region. FIG. 4C shows a superimposing state of the irradiation amounts shown in FIG. 4A and FIG. 4B.

FIG. 5A is a schematic plan view showing an overall structure of the photomask. FIG. 5B is a magnified view of a portion A shown in FIG. 5A. FIG. 5C is a magnified view of a portion B shown in FIG. 5A.

FIG. 7A is a schematic plan view showing a planer structure of a peripheral portion of the substrate and pixels formed in a display region of the substrate. FIG. 7B is a schematic sectional view showing a cross sectional structure of the substrate.

FIG. 8A is a schematic plan view showing a planer structure of a peripheral portion of the color filter substrate and pixels. FIG. 8B is a schematic sectional view showing a cross sectional structure of the color filter substrate.

FIG. 9A shows a configuration in which the markings are formed as concave portions. FIG. 9B shows a configuration in which the markings are formed as independent portions.

FIG. 10A is an external oblique view showing the entire color filter substrate. FIG. 10B is a magnified view of a region in which the markings are provided and its peripheral portion.

DETAILED DESCRIPTION OF THE INVENTION

A detailed description of embodiments of the present invention will now be provided with reference to FIGS. 1A to 10B.

Figure 1A:
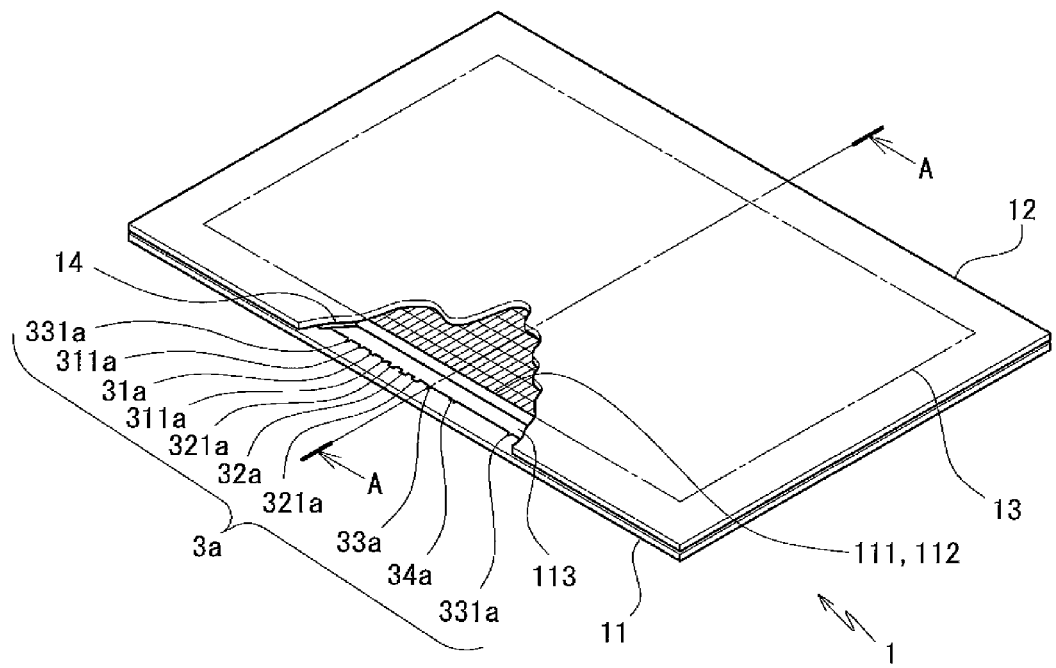
FIGS. 1A and 1B are schematic views showing a configuration of a liquid crystal display panel according to a first preferred embodiment of the present invention.
Figure 1B:
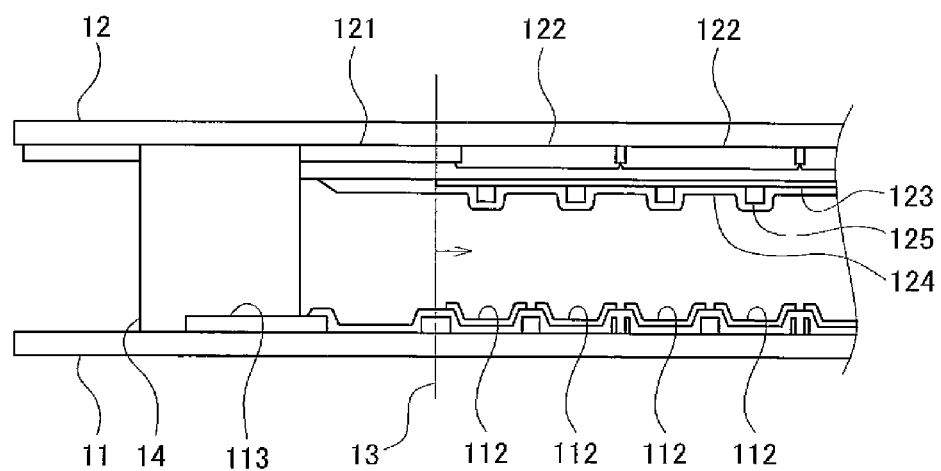

In a first embodiment of the present invention, a TFT array substrate on which thin film transistors are provided, and a common substrate on which a black matrix and color layers are formed, i.e., a color filter substrate are provided, and markings indicating boundary positions of divided exposure regions of elements to be formed on each substrate are provided on the TFT array substrate. FIGS. 1A and 1B are schematic views showing a configuration of a liquid crystal display panel according to the first embodiment of the present invention. FIG. 1A is a partial sectional view showing an overall structure of the liquid crystal display panel. FIG. 1B is a sectional view showing a part of a cross sectional structure of the liquid crystal display panel as viewed in the direction of the arrows A of FIG. 1A, where a peripheral portion of the liquid crystal display panel is shown.

A liquid crystal display panel 1 according to the first embodiment of the present invention has a TFT array substrate 11 and a color filter substrate 12. The TFT array substrate 11 has a region 13 in which elements such as thin film transistors 111 and pixel electrodes 112 are arranged in a matrix. Hereinafter, the region 13 is referred to as a "display region". In addition, a light shielding layer 113 arranged to prevent light leaks is formed outside the display region 13.

On the color filter substrate 12, there is provided a region 13 in which a black matrix 121 and color layers 122 of red, green and blue colors are arranged in a matrix. Hereinafter, this region 13 is referred to as a "display region" in a similar manner to the TFT array substrate 11. On the black matrix 121 and the color layers 122, transparent electrodes (common electrodes) 123, and an alignment layer 124 and alignment control structural elements 125 arranged to control alignment of liquid crystals are provided.

In the liquid crystal display panel 1, the TFT array substrate 11 and the color filter substrate 12 are placed so as to be opposed to each other having a given minute gap therebetween, and a sealing member 14 is provided so as to surround the display region 13. A region enclosed with the sealing member 14 seals in liquid crystals.

Photolithography is used for forming the thin film transistors 111 and the pixel electrodes 112 of the TFT array substrate 11, and the black matrix 121, the color layers 122 and the alignment control structural elements 125 of the color filter substrate 12.

Photolithography used for forming the thin film transistors 111 and the pixel electrodes 112 includes: 1. a coating step of coating a photoresist material on a thin film to be formed into a given pattern, i.e., a thin film of a material to be the thin film transistors 111 and the pixel electrodes 112; 2. a mask alignment step of placing a photomask at a given position; 3. an exposure step of irradiating light energy onto the coated photoresist material via the photomask; 4. a development step of removing unnecessary portions of the photoresist material; and 5. an etching step of removing unnecessary portions of the thin film.

Photolithography used for forming the black matrix 121, the color layers 122 and the alignment control structural elements 125 of the color filter substrate 12 includes: 1. a forming step of forming a thin film of a photoresist material to be formed into a given pattern, i.e., a photoresist material to be the black matrix 121 and the other elements; 2. a mask alignment step of placing a photomask at a given position; 3. an exposure step of irradiating light energy onto a given region of the photoresist material via the photomask; and 4. a development step of removing unnecessary portions of the photoresist material.

By repeating photolithography, the elements are formed in layers on the substrates, so that the TFT array substrate 11 and the color filter substrate 12 are obtained.

In the exposure steps of photolithography for forming the elements, divisional exposure is used. In the divisional exposure according to the first embodiment of the present invention, a specific range is designated in a pattern formed on the photomask, exposure is performed on each divided exposure region, while screen composition of a product pattern on the substrate is performed. On the light shielding layer 113 of the TFT array substrate 11, markings 3a (31a, 311a, 32a, 321a, 33a, 331a and 34a) indicating boundary positions of the divided exposure regions used when the divisional exposure is performed are provided.

Figure 2:
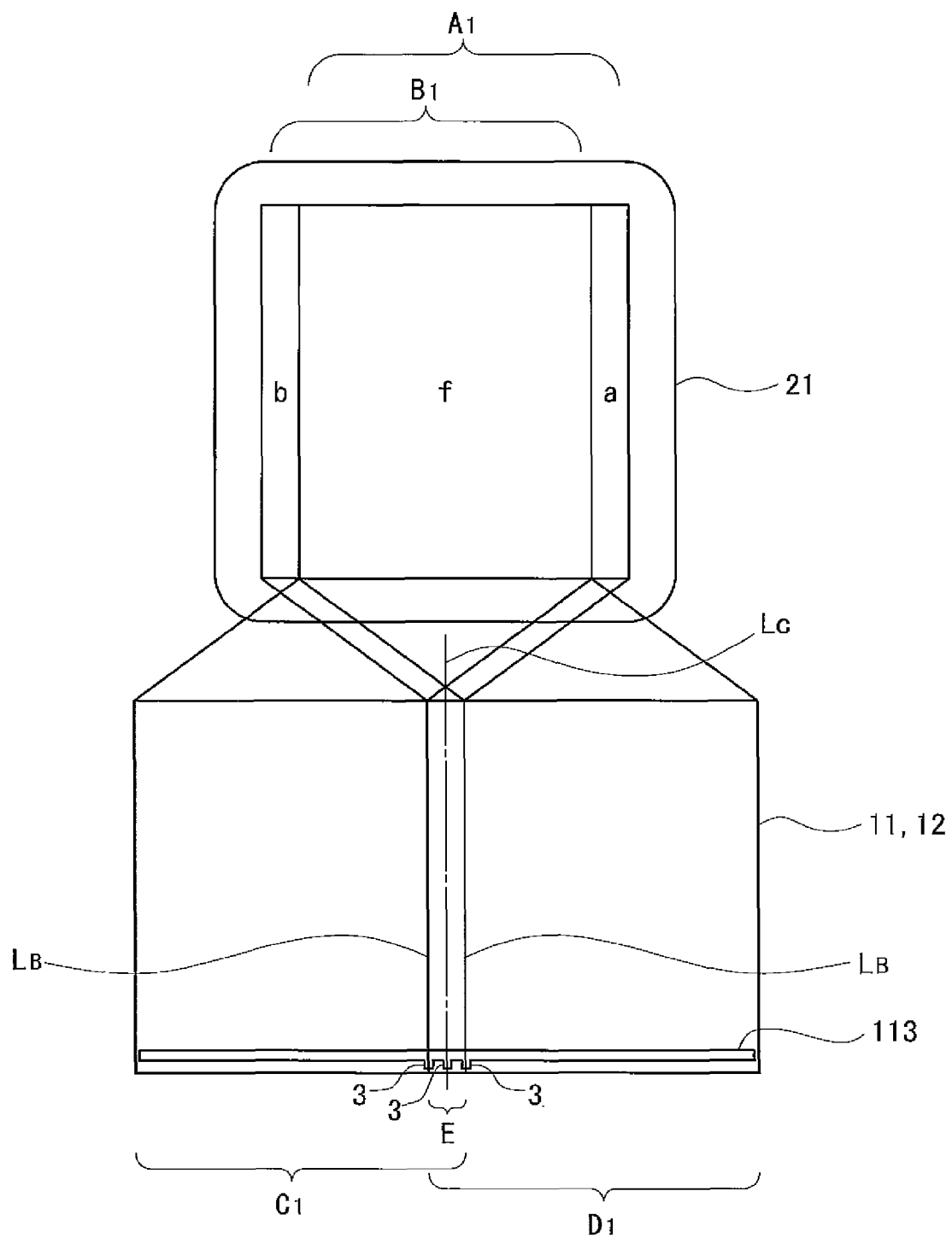
FIG. 2 is a schematic plan view showing a concept of first divisional exposure.
Figure 3:
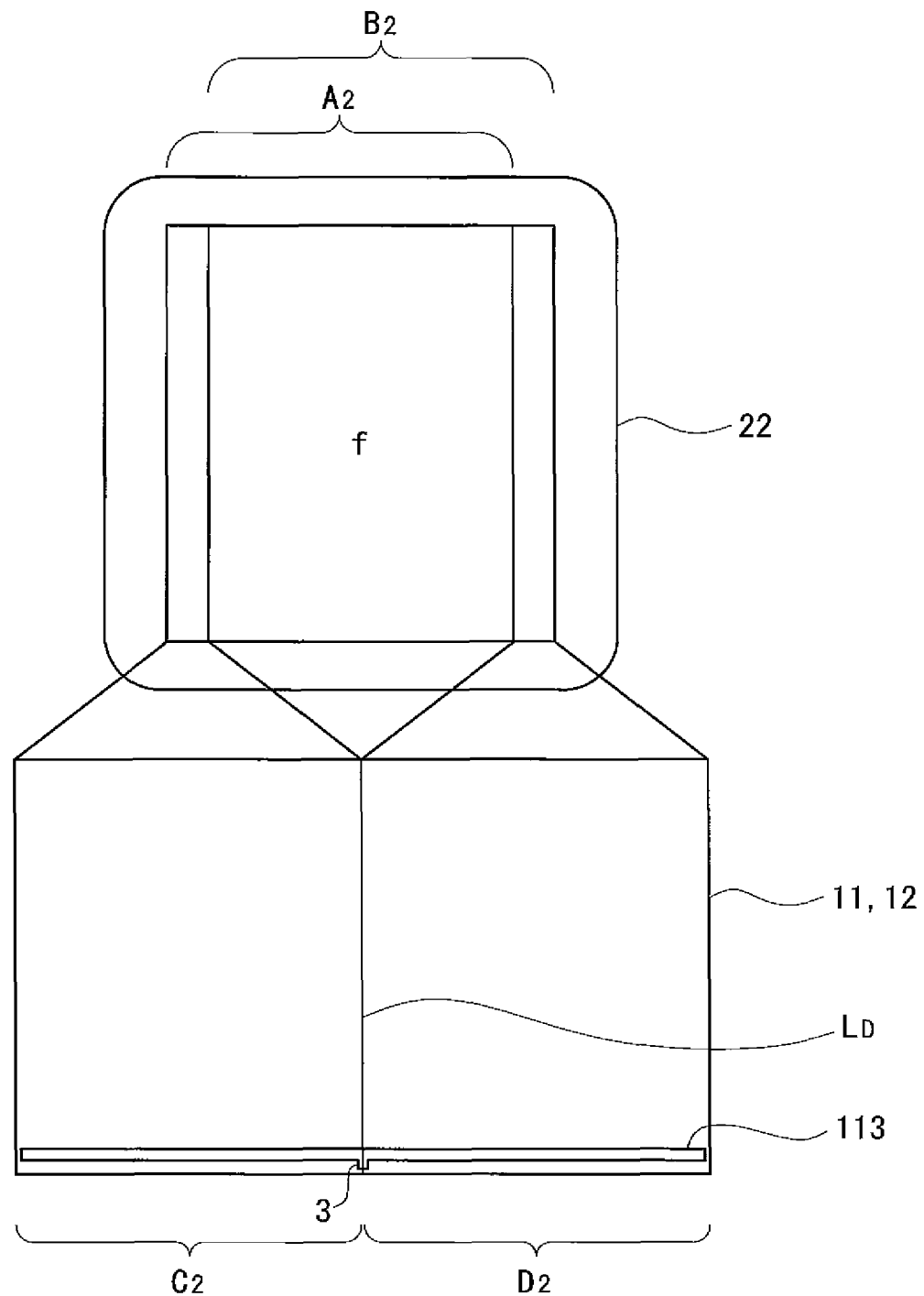
FIG. 3 is a schematic plan view showing a concept of second divisional exposure.

A description of the divided exposure used in producing the liquid crystal display panel 1 according to the first embodiment of the present invention will be provided. Here, first divisional exposure and second divisional exposure to be described below are selectively performed depending on the elements to be formed. FIG. 2 is a schematic plan view showing a concept of the first divisional exposure. FIG. 3 is a schematic plan view showing a concept of the second divisional exposure. In the first embodiment of the present invention, exposure is performed by dividing a region to be exposed of a surface of the substrate into two exposure regions.

The first divisional exposure shown in FIG. 2 is a method of making boundary portions of divided exposure regions coincide with each other. One of the divided exposure regions (e.g., a divided exposure region $C_1$) on the substrate 11,12 is subjected to exposure via a given region of a photomask 21 (in this case, a region $A_1$). The other divided exposure region (in this case, a divided exposure region $D_1$) on the substrate 11,12 is subjected to exposure via another given region of the photomask (in this case, a region $B_1$).

The regions $A_1$ and $B_1$ of the photomask 21 at least partly coincide with each other and share a given area "f" of the photomask 21. By performing exposure on each of the divided exposure regions $C_1$ and $D_1$ on the substrate 11,12 via the respective regions $A_1$ and $B_1$ having the coinciding portions, the product pattern is compositely formed on the substrate 11,12. Owing to such a configuration, exposure can be performed on a large area substrate with a small area photomask.

In the first divisional exposure, there is provided a region E where the boundary portions of the divided exposure regions $C_1$ and $D_1$ on the substrate 11,12 coincide with each other.

The region E is referred to as a "boundary region". In other words, exposure is performed on the boundary region E via both of an edge area "a" of the region $A_1$ of the photomask 21 and an edge area "b" of the region $B_1$ of the photomask 21. When the boundary region E undergoes irradiation of light energy once via the area "a" and once via the area "b", exposure amounts in the boundary region E become substantially equal to an exposure amount in a region of each divided exposure region (e.g., a region irradiated with light energy via the area "f" of the photomask).

In order to make exposure amounts in the boundary region E equal to an exposure amount in a region of each divided exposure region, there are used an exposure method in which the irradiation amount of light energy on the boundary region E is controlled in each exposure so that a final exposure amount in the boundary region E can be equal to an exposure amount in a region of each divided exposure region, and an exposure method in which minute regions on which light energy is irradiated and minute regions on which light energy is not irradiated are mixed in a mosaic like manner in the boundary region E, so that the entire boundary region E ultimately undergoes irradiation of light energy. Descriptions of these methods will be provided later.

A marking 3 indicating a boundary position of the divided exposure regions in the first divisional exposure is provided at at least one of a center line $L_c$ and edge positions $L_B$ of the boundary region E. In the following descriptions, the center line and the edge positions of the boundary region of the divided exposure regions are sometimes simply referred to as the "boundary positions of the divided exposure regions". FIG. 2 shows a configuration in which the markings 3 are provided at all of the center line $L_C$ and the edge positions $L_B$ of the boundary region E. Providing the markings 3 allows grasping the boundary positions $L_c$ and $L_B$ of the divided exposure regions of each formed element even after production of the substrate 11,12 or the liquid crystal display panel 1. In addition, making the shapes of the markings 3 differ with each element allows distinguishing between the boundary positions of the divided exposure regions of the respective elements.

The second divisional exposure shown in FIG. 3 is a method of not making boundary portions of divided exposure regions coincide with each other. One of the divided exposure regions (e.g., a divided exposure region $C_2$) on the substrate 11,12 is subjected to exposure via a given region of a photomask 22 (in this case, a region $A_2$). The other divided exposure region (in this case, a divided exposure region $D_2$) on the substrate 11,12 is subjected to exposure via another given region of the photomask 22 (in this case, a region $B_2$).

The regions $A_2$ and $B_2$ of the photomask 22 at least partly coincide with each other and share a given area "f" of the photomask 22. By performing exposure on each of the divided exposure regions $C_2$ and $D_2$ on the substrate 11,12 via the respective regions $A_2$ and $B_2$ having the coinciding portions, a product pattern is compositely formed on the substrate 11,12. Owing to such a configuration, exposure can be performed on a large area substrate with a small area photomask.

On the light shielding layer 113 of the TFT array substrate 11, a marking 3 indicating a boundary position $L_D$ of the divided exposure regions is provided. The marking 3 is located at the boundary position $L_D$ or in the vicinity thereof and is formed so that the outline of the light shielding layer 113 has a convex portion of a given shape. The marking 3 has the same function and exerts the same action and effect as the marking in the first divisional exposure.

In the liquid crystal display panel 1 according to the first embodiment of the present invention, the first divisional exposure is used for performing patterning of the elements making up the thin film transistors 111 and the pixel electrodes 112 of the TFT array substrate 11 and the black matrix 121 of the color filter substrate 12. The exposure amount in the boundary region E is made uniform by adjusting the irradiation amount of light energy on the boundary region E. For performing patterning of the alignment control structural elements 125 of the color filter substrate 12, the first divisional exposure is used. The exposure amount in the boundary region E is made uniform by using the exposure method in which the minute regions on which light energy is irradiated and the minute regions on which light energy is not irradiated are mixed in a mosaic like manner in the boundary region E. For performing patterning of the color layers 122 of the color filter substrate 12, the second divisional exposure is used.

Figure 4A:
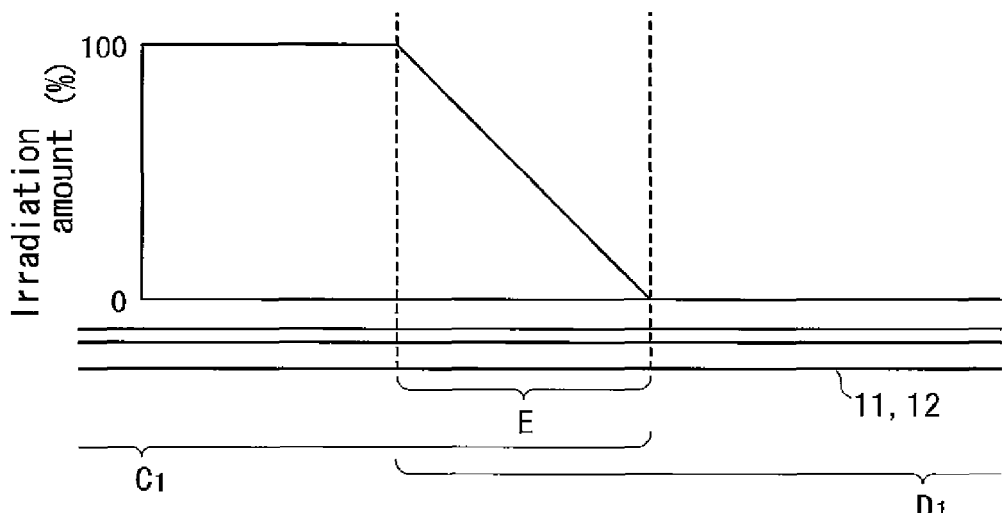
FIGS. 4A to 4C schematically show a configuration in which an exposure amount is made uniform by adjusting an irradiation amount of light energy on a boundary region of divided exposure regions in the case of using the first divisional exposure.
Figure 4B:
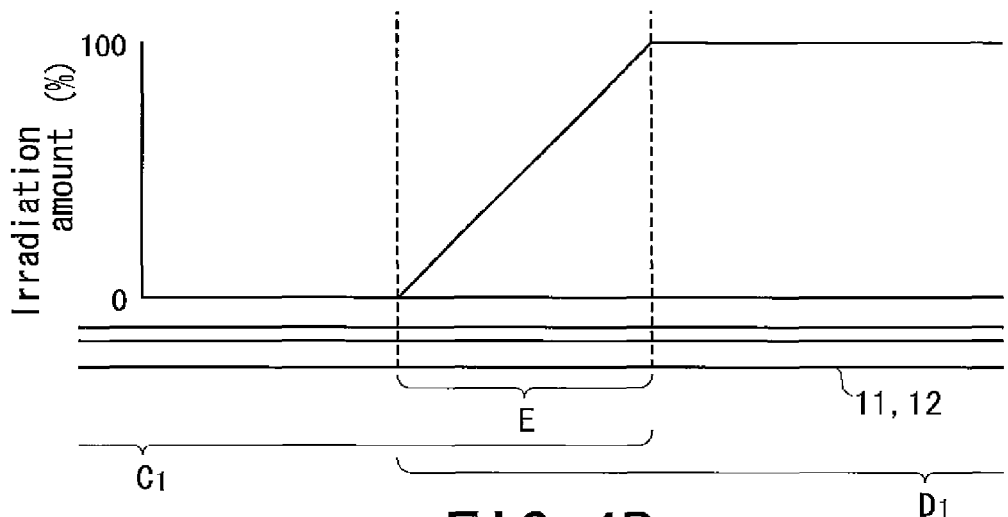
Figure 4C:
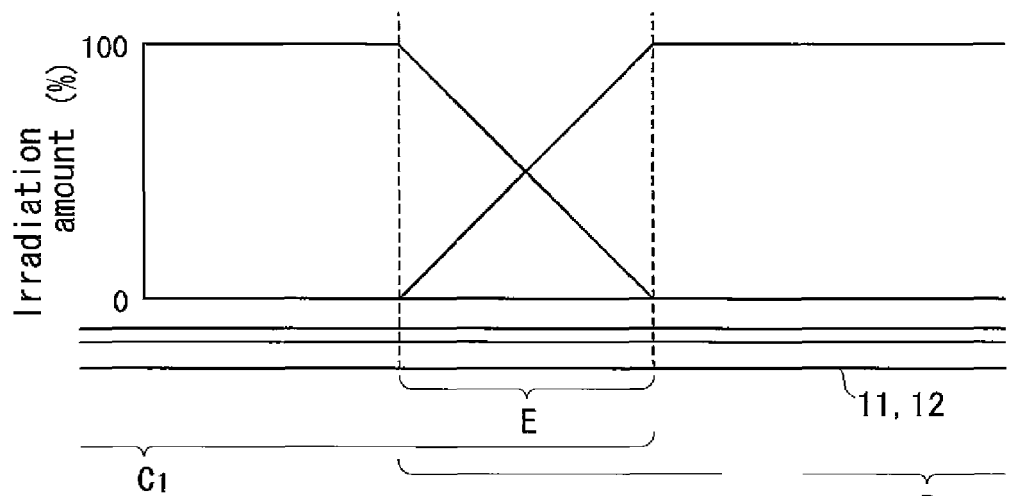

Next, a description of the configuration in which the irradiation amount of light energy on the boundary region E is made uniform in the case of the first divisional exposure will be provided. First, a description of the method of adjusting the irradiation amount of light energy on the boundary region E will be provided. FIGS. 4A to 4C show the irradiation amount of light energy on the boundary region E. To be more specific, FIG. 4A shows an irradiation amount of light energy when the divided exposure region $C_1$ is subjected to exposure, FIG. 4B shows an irradiation amount of light energy when the divided exposure region $D_1$ is subjected to exposure, and FIG. 4C shows a superimposing state of the irradiation amounts shown in FIG. 4A and FIG. 4B.

When light energy is irradiated onto the divided exposure region $C_1$, light energy is simultaneously irradiated also onto the boundary region E. At this time, the irradiation amount of light energy on the boundary region E is set to be gradually decreased toward the edge of the divided exposure region $C_1$ as shown in FIG. 4A.

Similarly, when light energy is irradiated onto the divided exposure region $D_1$, the irradiation amount of light energy on the boundary region E is set to be gradually decreased toward the edge of the divided exposure region $D_1$ as shown in FIG. 4B.

It is set so that the sum of the irradiation amounts of light energy on the boundary region E by two times of irradiation becomes equal to the irradiation amount of light energy on a region of the divided exposure region $C_1$, $D_1$. Owing to such a configuration, the irradiation amount of light energy over the entire irradiated region of the substrate 11, 12 becomes uniform.

Figure 5A:
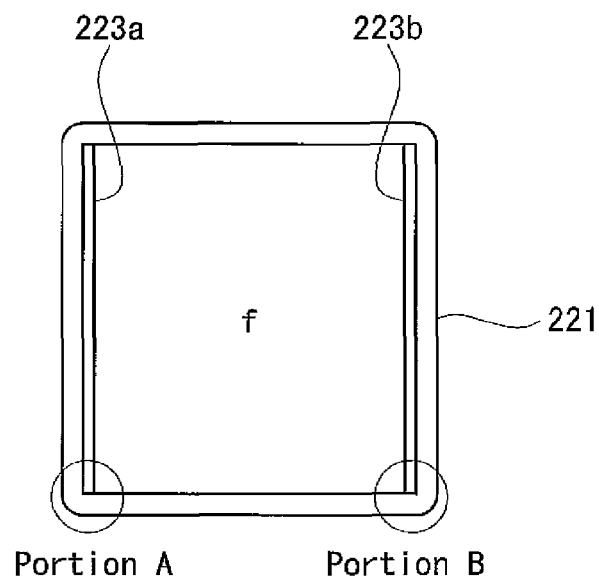
FIGS. 5A to 5C are schematic plan view showing a structure of a photomask used in divisional exposure of alignment control structural elements.
Figure 5B:
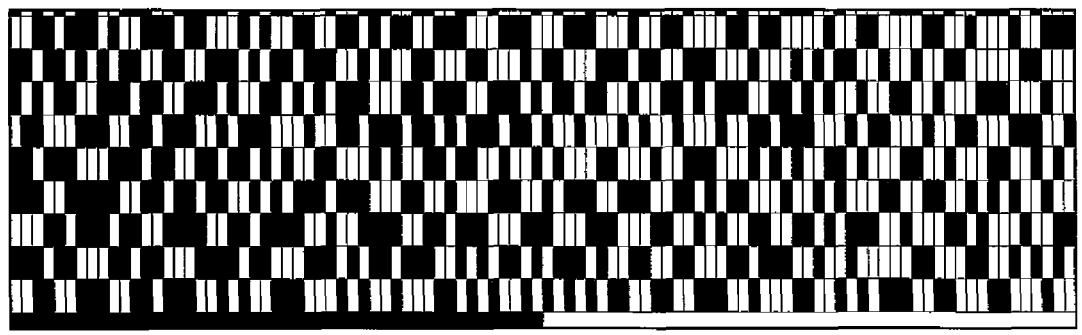
Figure 5C:
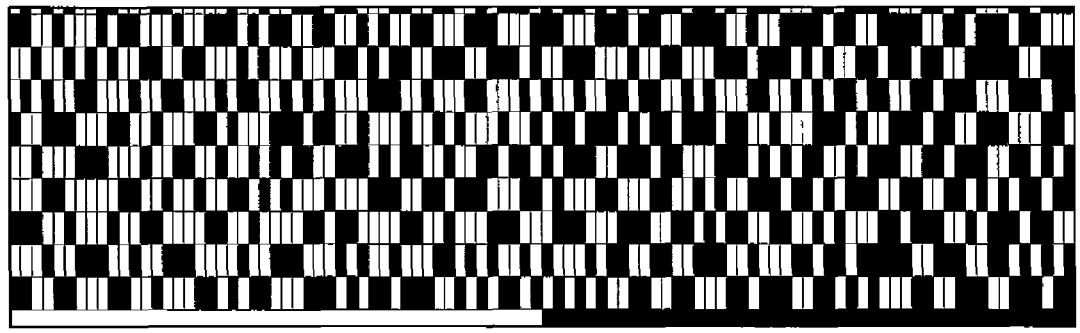

Next, a description of the method of mixing the minute regions on which light energy is irradiated and the minute regions on which light energy is not irradiated in a mosaic like manner in the boundary region E will be provided. Here, a description of the divisional exposure of the alignment control structural elements 125 is provided as an example, in which positive exposure is used. FIGS. 5A to 5C are schematic plan views showing a structure of a photomask to be used in the divisional exposure of the alignment control structural elements. FIG. 5A is a schematic plan view showing an overall structure of the photomask. FIG. 5B is a magnified view of a portion A shown in FIG. 5A. FIG. 5C is a magnified view of a portion B shown in FIG. 5A.

On a photomask 221, a region "f" in which patterns for forming the alignment control structural elements are arranged in a matrix at positions corresponding to pixels on the color filter substrate. For example, if the alignment control structural elements consist of a photoresist material of which portions subjected to irradiation of light in the exposure step are removed in the development step, light shielding patterns having substantially the same shape as the alignment control structural elements are arranged in a matrix in the area "f".

In the vicinity of the opposed edges of the area "f", there are provided regions each of which is a mixture of patterns for forming the alignment control structural elements on the pixels on the substrate and patterns for preventing the pixels on the substrate from exposure (i.e., patterns for light shielding all of the regions corresponding to the pixels on the substrate). Hereinafter, the regions are referred to as mixture regions 223a and 223b. In FIGS. 5B and 5C, squares shown in white are areas in each of which the pattern for forming the alignment control structural elements is formed, and squares shown in black are areas in each of which the pattern for preventing the pixels on the substrate from exposure is formed.

As shown in FIGS. 5B and 5C, the squares are arranged so that when the mixture regions 223a and 223b coincide with each other, the squares for forming the alignment control structural elements in the mixture region 223a and the squares for light shielding in the mixture region 223b coincide with each other. In addition, the mixture regions 223a and 223b are arranged such that the number of squares for forming the alignment control structural elements is gradually decreased toward each edge of the photomask 221.

Accordingly, by subjecting the boundary region of the divided exposure regions on the substrate to exposure once via the mixture region 223a and once via the mixture region 223b, the pixels in the boundary region are subjected to exposure once via either of the mixture regions 223a and 223b. Owing to such divisional exposure, the boundary between the divided exposure regions does not clearly appear, thus preventing streaky luminance differences or color irregularities.

Figure 6:
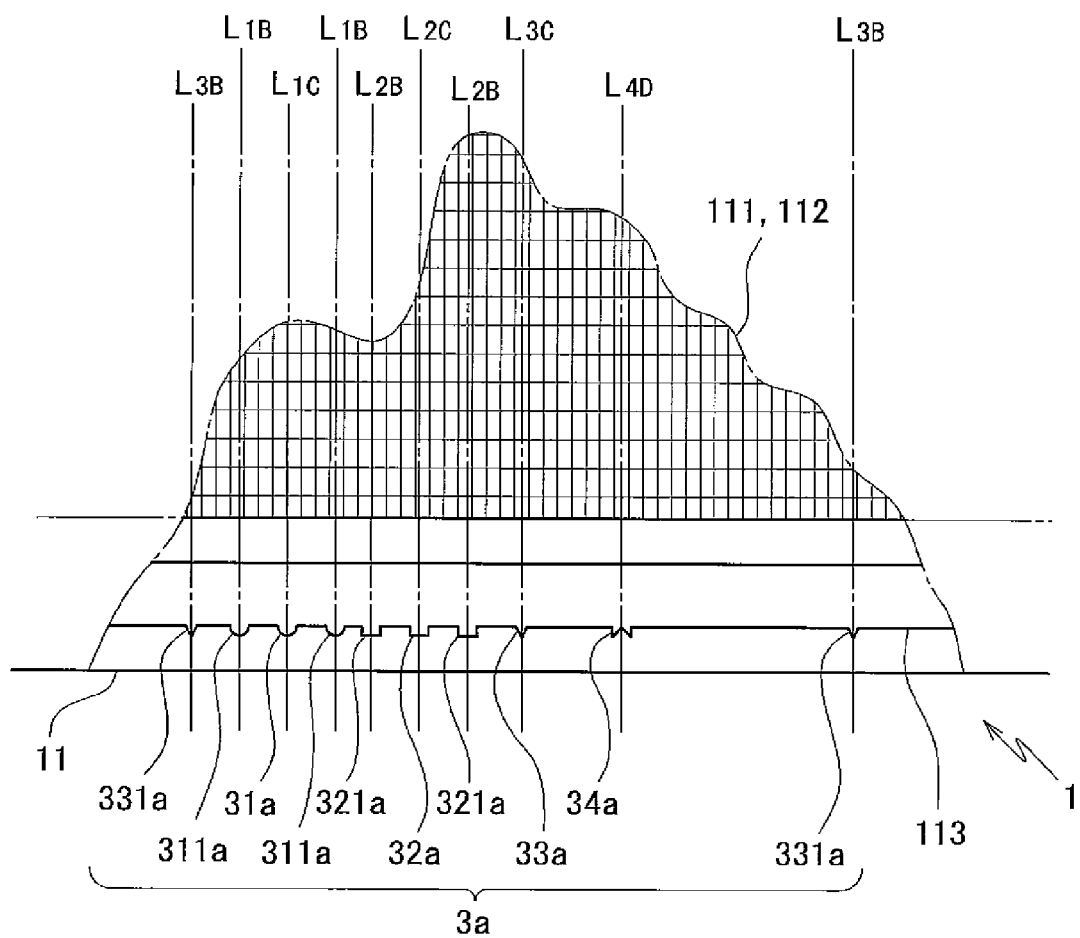
FIG. 6 is a schematic plan view showing a configuration of markings on the display panel according to the first preferred embodiment of the present invention.

Next, a description of a configuration of the markings on the liquid crystal display panel according to the first embodiment of the present invention will be provided. FIG. 6 is a schematic plan view showing a configuration of the markings 3a on the liquid crystal display panel 1 according to the first embodiment of the present invention. As shown in FIG. 6, the markings 3a provided to the light shielding layer 113 of the TFT array substrate 11 includes the following markings.

1. The marking 31a indicating a center line $L_{1C}$ of the boundary region of the divided exposure regions of the elements making up the thin film transistors 111 of the TFT array substrate 11; 2. the markings 311a indicating edge positions $L_{1B}$ of the boundary region of the divided exposure regions of the elements making up the thin film transistors 111 of the TFT array substrate 11; 3. the marking 32a indicating a center line $L_{2C}$ of the boundary region of the divided exposure regions of the black matrix 121 of the color filter substrate 12; 4. the markings 321a indicating edge positions $L_{2B}$ of the boundary region of the divided exposure regions of the black matrix 121 of the color filter substrate 12; 5. the marking 33a indicating a center line $L_{3c}$ of the boundary region of the divided exposure regions of the alignment control structural elements 125; 6. the markings 331a indicating edge positions $L_{3B}$ of the boundary region of the divided exposure regions of the alignment control structural elements 125; and 7. the marking 34a indicating a boundary $L_{4D}$ between the divided exposure regions of the color layers 122.

As shown in FIG. 6, the boundary region of the divided exposure regions of the thin film transistors 111 (a region between the edge positions $L_{1B}$ in FIG. 6) and the boundary region of the divided exposure regions of the black matrix 121 (a region between the edge positions $L_{2B}$ in FIG. 6) are located at such positions that they do not coincide with each other (i.e., they deviate from each other). More preferably, the boundary regions are located at such positions that they do not overlap with each other. This is because in order to determine which of the TFT array substrate 11 and the color filter substrate 12 is responsible for the streaky luminance differences or color irregularities on the display panel, it is necessary to locate the boundary region of the divided exposure regions of the thin film transistors 111 and the boundary region of the divided exposure regions of the black matrix 121 at such positions that they do not coincide with other.

For the black matrix 121 and the thin film transistors 111, the above-described method of making the exposure amount uniform by adjusting the irradiation amount of light energy on the boundary region in the case of the first divisional exposure is used. The black matrix 121 and the thin film transistors 111 may be subjected to exposure by means of one exposure device. Therefore, there is a case where the boundary positions of the divided exposure regions of them cannot be significantly deviated from each other.

In such a case, if streaky luminance differences or color irregularities occur in the display panel, it is difficult to specify of which element the boundary region of the divided exposure regions where the streaky luminance differences or color irregularities occur is without making measurement on the occurring position of the streaky luminance differences or color irregularities. Therefore, providing the markings indicating the boundary positions of the divided exposure regions of the black matrix 121 and the markings indicating the boundary positions of the divided exposure regions of the thin film transistors 111 considerably saves an effort of checking the boundary region of the divided exposure regions and an effort of checking display quality.

The alignment control structural elements could be different in the size of the boundary region of the divided exposure regions according to the type of display. In such a case, providing the markings indicating the boundary positions $L_{3C}$ and $L_{3B}$ of the divided exposure regions of the alignment control structural elements can considerably saves an effort of checking. FIG. 6 shows a configuration in which the boundary regions of the divided exposure regions of the black matrix 121 and the thin film transistor 111 are positioned within the boundary region of the divided exposure regions of the alignment control structural elements. However, the positional relation between the boundary region of the divided exposure regions of the black matrix 121 or the thin film transistors 111 and the boundary region of the divided exposure regions of the alignment control structural elements is not specifically limited. The positional relation among the boundary region of the divided exposure regions of the color layers 122 and the boundary regions of the divided exposure regions of the other elements is not specifically limited either.

Distinguishing between the boundary positions $L_{1C}$, $L_{1B}$, $L_{2C}$, $L_{2B}$, $L_{3C}$, $L_{3B}$ and $L_{4D}$ of the divided exposure regions of the respective elements allows specifying of which element the boundary between the divided exposure regions where the streaky luminance differences or color irregularities occur is when the streaky luminance differences or color irregularities are detected by inspection after production. In other words, specifying the occurring position of the streaky luminance differences or color irregularities allows specifying the forming step of which element is responsible for the streaky luminance differences or color irregularities. This detection result can be used in production process management and evaluation.

It is preferable that the shapes of the markings 3a indicating the boundary positions $L_{1C}$, $L_{1B}$, $L_{2C}$, $L_{2B}$, $L_{3C}$, $L_{3B}$ and $L_{4D}$ of the divided exposure regions of the respective elements are made differ with each element. Making the shapes of the markings 3a differ facilitates the above-described specification. In other words, checking the shapes of the markings 3a on extended lines of the streaky luminance differences or color irregularities allows immediately specifying of which element the boundary between the divided exposure regions where the streaky luminance differences or color irregularities occur is.

Thus, it becomes unnecessary to perform works such as measurement on the occurring position of the streaky luminance differences or color irregularities by means of a measure, which simplifies inspection works and improves inspection efficiency.

Tracing extended lines of the markings 3a on the display region allows checking whether or not streaky luminance differences or color irregularities have occurred in the boundary region of the divided exposure regions. Thus, quality of the liquid crystal display panel can be easily checked.

Next, descriptions of the configuration of the liquid crystal display panel and the overall flow of a production method thereof according to the first embodiment of the present invention will be provided. The production method of the liquid crystal display panel according to the first embodiment of the present invention includes a TFT array substrate producing step, a color filter substrate producing step and a panel (cell) producing step.

Figure 7A:
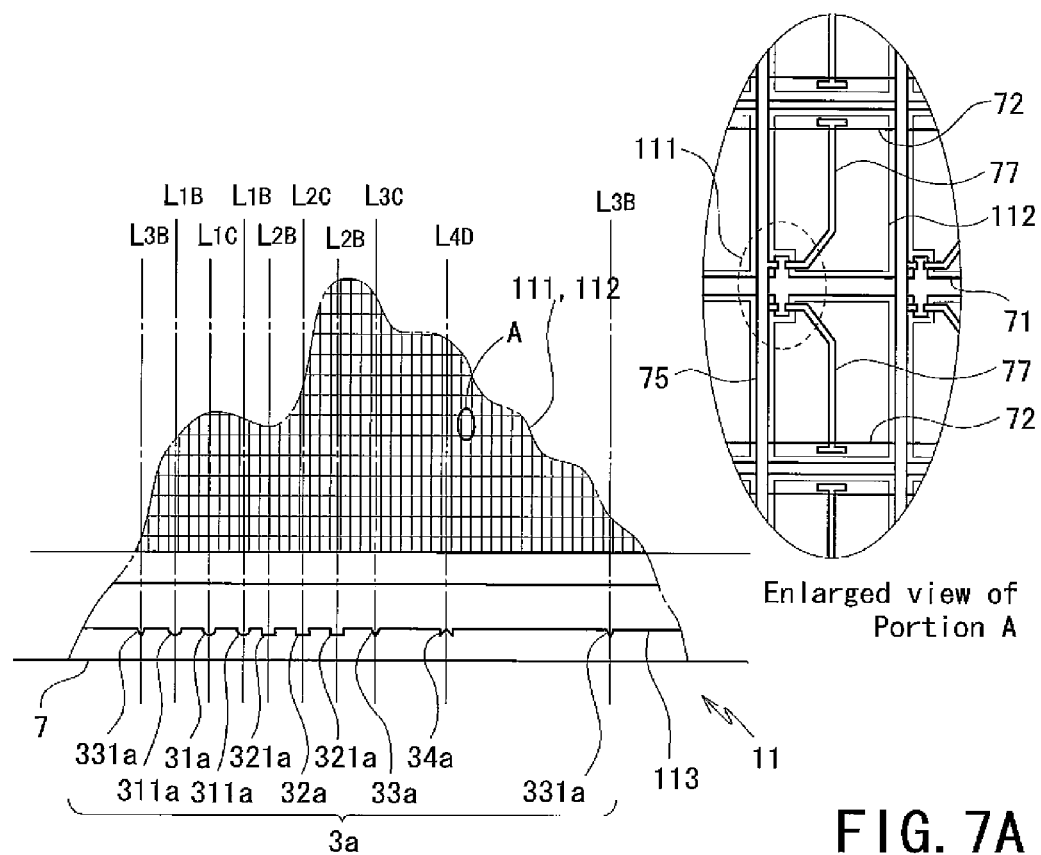
FIGS. 7A and 7B are schematic views showing a configuration of a TFT array substrate of the display panel according to the first preferred embodiment of the present invention.
Figure 7B:
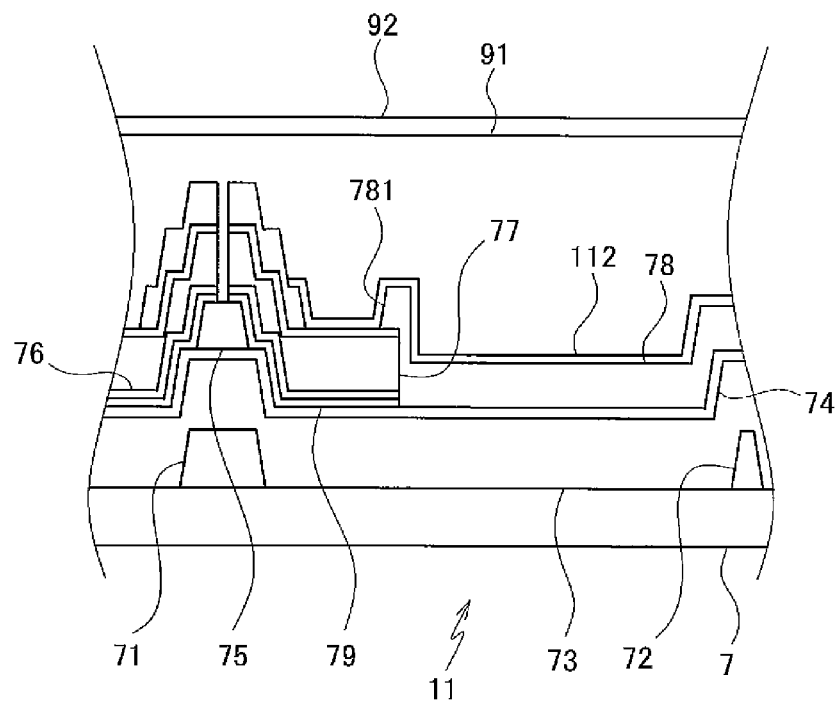

FIGS. 7A and 7B are schematic views showing a structure of the TFT array substrate of the liquid crystal display panel according to the first embodiment of the present invention. FIG. 7A is a schematic plan view showing a planar structure of a peripheral portion of the TFT array substrate and pixels formed on the TFT array substrate. FIG. 7B is a schematic sectional view showing a cross sectional structure of the TFT array substrate. FIG. 7B is a schematic diagram for illustrating the structure of the TFT array substrate and is not a cross sectional view along a specific section line.

The TFT array substrate 11 has a configuration in which elements such as scanning signal lines (gate signal lines) 71, auxiliary capacitance lines 72, the light shielding layer 113, a gate insulator 73, a semiconductor film 74, an insulator 75, data signal lines (source signal lines) 76, drain lines 77, a first protective film 78, the pixel electrodes 112, a second protective film 91 and an alignment layer 92 are provided in layers on a transparent substrate 7 preferably made of glass.

The scanning signal lines (gate signal lines) 71 are provided at given intervals within the display region 13 so as to be substantially parallel to one another. The auxiliary capacitance lines 72 are provided at given intervals from the scanning signal lines (gate signal lines) 71 on both sides of the scanning signal lines (gate signal lines) 71 so as to be substantially parallel to one another.

The light shielding layer 113 is provided outside the display region 13 along a peripheral portion of the transparent substrate 7 and is substantially in the shape of a strip. On the light shielding layer 113, the marking 31a indicating the center line $L_{1C}$ of the boundary region of the divided exposure regions of the thin film transistors 111 of the TFT array substrate 11, the markings 311a indicating the edge positions $L_{1B}$ thereof, the marking 32a indicating the center line $L_{2C}$ of the boundary region of the divided exposure regions of the black matrix of the color filter substrate 12, the markings 321a indicating the edge positions $L_{2B}$ thereof, the marking 33a indicating the center line $L_{3C}$ of the boundary region of the divided exposure regions of the alignment control structural elements, the markings 331a indicating the edge positions $L_{3B}$ thereof, and the marking 34a indicating the boundary $L_{4D}$ between the divided exposure regions of the color layers 122 are provided.

As shown in FIG. 7A, the markings 31a, 311a, 32a, 321a, 33a, 331a and 34a are provided in such a manner that the outline of the light shielding layer 113 has convex portions toward the outer rim of the transparent substrate 7. The markings 31a, 311a, 32a, 321a, 33a, 331a and 34a have different shapes so as to allow specifying which of the boundary positions $L_{1C}$, $L_{1B}$, $L_{2B}$, $L_{2C}$, $L_{3C}$, $L_{3B}$ and $L_{4D}$ the respective markings indicate.

For example, the markings 31a and 311a indicating the boundary positions $L_{1C}$ and $L_{1B}$ of the divided exposure regions of the thin film transistors are convex portions in the shape of a semi-circle. The markings 32a and 321a indicating the boundary positions $L_{2C}$ and $L_{2B}$ of the divided exposure regions of the black matrix are convex portions in the shape of a square. The markings 33a and 331a indicating the boundary positions $L_{3C}$ and $L_{3B}$ of the divided exposure regions of the alignment control structural elements are convex portions substantially in the shape of a triangle. The marking 34a indicating the boundary $L_{4D}$ between the divided exposure regions of the color layers is a convex portion substantially in the shape of a letter M.

The TFT array substrate producing step will be described.

First, the scanning signal lines (gate signal lines) 71, the auxiliary capacitance lines 72 and the light shielding layer 113 are formed on the transparent substrate 7. To be specific, on the transparent substrate 7, a conductor film of a single layer or multiple layers preferably consisting of tungsten, titanium, aluminum, or chromium is formed. For forming the conductor film, sputtering is preferably used. Then, a photoresist material is coated on the conductor film, and the coated photoresist material is subjected to exposure via a photomask so as to have a given pattern.

For this exposure, the first divisional exposure is used. For making the exposure amount uniform in the boundary region of the divided exposure regions, the method of adjusting the irradiation amount of light energy on the boundary region is used. In this divisional exposure, a photomask having a pattern for forming the scanning signal lines (gate signal lines) 71, the auxiliary capacitance lines 72, and the light shielding layer 113 on which the markings 31a, 32a and 33a are provided is used. Owing to such a photomask, it is possible to provide the markings 3a on the TFT array substrate 11 without increasing the number of process steps.

After the completion of the exposure on the entire divided exposure regions, unnecessary portions of the photoresist material are removed in the development step. Then, unnecessary portions of the conductor film, i.e., portions exposed by the development step are removed by the etching step. Through these steps, the scanning signal lines (gate signal lines) 71, the auxiliary capacitance lines 72, and the light shielding layer 113 on which the markings 3a are provided of given shapes are obtained.

Then, the gate insulator 73 is formed. The gate insulator 73 preferably consists of silicon nitride and is preferably formed by plasma CVD.

The semiconductor film 74 is formed on the gate insulator 73. The semiconductor film 74 preferably consists of $n^+$ amorphous silicon and is preferably formed by plasma CVD.

Then, the insulator 75 is formed. The insulator 75 preferably consists of silicon nitride. First, a silicon nitride film is formed preferably by plasma CVD, and then the silicon nitride film is formed into a given pattern preferably by photolithography. Thus, the insulator 75 of a given pattern is obtained. For the divisional exposure by photolithography, the first divisional exposure is used. The exposure amount in the boundary region is made uniform by the method of adjusting the irradiation amount of light energy on the boundary region. The boundary positions of the divided exposure regions of the insulator 75 are set at the same positions as the boundary positions of the divided exposure regions for forming the scanning signal lines (gate signal lines) 71.

Then, the contact layer 79 is formed. The contact layer 79 preferably consists of n+ amorphous silicon, and is preferably formed by plasma CVD. The contact layer 79 is provided in order to have a favorable ohmic contact with the data signal lines (source signal lines) 76 and the drain lines 77 to be formed later. Then, the data signal lines (source signal lines) 76 and the drain lines 77 are formed. The data signal lines (source signal lines) 76 are formed so as to extend in a direction substantially perpendicular to the scanning signal lines (gate signal lines) 71 and the auxiliary capacitance lines 72, and are located at given intervals within the display region 13 of the TFT array substrate 11 so as to be substantially parallel to one another.

The data signal lines (source signal lines) 76 and the drain lines 77 consist of conductors such as titanium, aluminum, chromium and molybdenum, and are preferably formed by photolithography. For the divisional exposure, the first divisional exposure is used. The exposure amount in the boundary region of the divided exposure regions is made uniform by the method of adjusting the irradiation amount of light energy on the boundary region. The boundary positions of the divided exposure regions are set at the same positions as the boundary positions of the divided exposure regions for forming the scanning signal lines (gate signal lines) 71.

Through the steps as described above, the thin film transistors 111 are formed on the transparent substrate 7.

Then, the first protective film 78 is formed, and contact holes 781 are formed on the first protective film 78 by photolithography.

On the first protective film 78, transparent electrodes (pixel electrodes) 112 are formed. First, a transparent conductive material film such as an ITO (Indium Tin Oxide) film is formed preferably by sputtering. Then, the thus-formed ITO film is formed into a given pattern preferably by photolithography. Thus, the transparent electrodes (pixel electrodes) 112 of a given pattern are obtained. In the exposure by photolithography, the first divisional exposure is used. The exposure amount in the boundary region of the divided exposure regions is made uniform by the method of adjusting the irradiation amount of light energy on the boundary region.

On the thus-formed pixel electrodes 112, the second protective film 91 preferably consisting of silicon nitride is formed.

Through the steps as mentioned above, the TFT array substrate 11 is obtained.

Next, descriptions of a configuration of the color filter substrate and producing steps thereof will be provided.

Figure 8A:
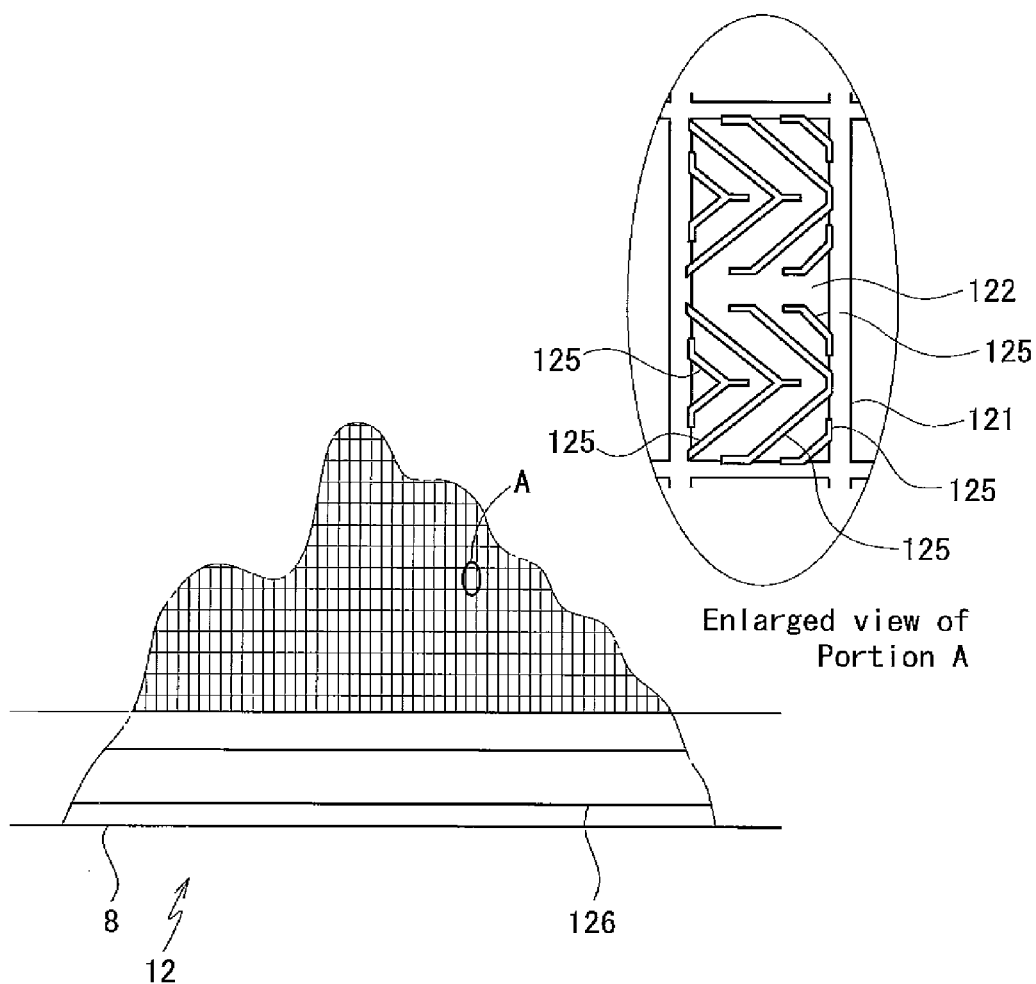
FIGS. 8A and 8B are schematic views showing a configuration of a color filter substrate of the display panel according to the first preferred embodiment of the present invention.
Figure 8B:
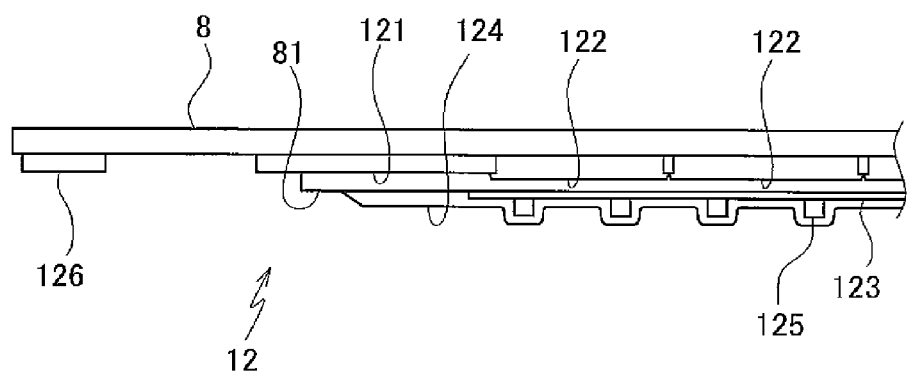

FIGS. 8A and 8B are schematic views showing a structure of the color filter substrate 12. FIG. 8A provides a view showing a peripheral portion of the color filter substrate 12 and a plan view showing a configuration of one pixel. FIG. 8B is a schematic sectional view showing a cross sectional structure of the color filter substrate 12.

As shown in FIGS. 8A and 8B, the color filter substrate 12 is provided such that the black matrix 121 and a light shielding layer 126 are formed on a transparent substrate 8 preferably consisting of glass, and the color layers 122 each consisting of a color sensitive material of anyone of red, green and blue colors are individually formed in each square of the black matrix 121. On the black matrix 121 and the color layers 122, a protective film 81 is formed, and a film of the transparent electrodes (common electrodes) 123 is formed on the protective film 81. The alignment control structural elements 125 arranged to control alignment of liquid crystals are formed on the transparent electrodes (common electrodes) 123. The alignment layer 124 is formed on the transparent electrodes (common electrodes) 123 and the alignment control structural elements 125.

The color filter substrate producing step includes a black matrix forming step, a color layer forming step, a protective film forming step, and a transparent electrode (common electrode) forming step.

In the black matrix forming step, in the case of using a resin BM (black matrix) method, a BM resist (a sensitive resin composition containing a black coloring agent) is coated on the transparent substrate. Then, the BM resist is formed into a given pattern preferably by photolithography. Thus, the black matrix 121 and the light shielding layer 126 of a given pattern are obtained. The light shielding layer 126 is an element arranged to prevent transmission of unnecessary light, and is located at a given position outside the display region 13.

For the divisional exposure of the black matrix 121, the first divisional exposure is used. The exposure amount in the boundary region of the divided exposure regions is made uniform by the method of adjusting the irradiation amount of light energy on the boundary region.

In addition, the boundary region of the divided exposure regions of the black matrix 121 is preferably set at a position different from the boundary region of the divided exposure regions of each of the elements making up the thin film transistors 111 of the TFT array substrate 11. In this case, the boundary region of the divided exposure regions of the black matrix 121 may be adjacent to the boundary region of the divided exposure regions of each of the elements making up the thin film transistors 111 of the TFT array substrate 11.

In the color layer forming step, the color layers 122 of red, green and blue colors for color display are formed. In the case of using a color sensitive material method, a color sensitive material (a solution in which a pigment of a given color is dispersed in a photosensitive resin) is coated on the transparent substrate 8 on which the black matrix 121 has been formed. Then, the color sensitive material is formed into a given pattern preferably by photolithography. This step is repeated for each of red, green and blue colors, and thereby the color layers 122 of red, green and blue colors are obtained.

In the protective film forming step, the protective film 81 is formed on the black matrix 121 and the color layers 122. For example, a method of coating a protective film material on the substrate by means of a spin coater (an overall coating method), and a method of forming a protective film of a given pattern by printing or photolithography (a patterning method) are preferably used. For the protective film material, an acrylic resin and an epoxy resin are preferably used.

In the transparent electrode (common electrode) forming step, the transparent electrodes (common electrodes) 123 are formed on the protective film 81. In the case of using a masking method, the transparent electrodes (common electrodes) 123 are formed by placing a mask on the substrate and preferably depositing ITO (Indium Tin Oxide) by sputtering.

Then, the alignment control structural elements 125 are formed. A photoresist material is coated on the transparent electrodes 123, and the photoresist material is subjected to exposure via the photomask so as to have a given pattern as shown in FIG. 8A. Then, unnecessary portions are removed in the development step, so that the alignment control structural elements 125 of a given pattern are obtained.

Through these steps, the color filter substrate 12 is obtained.

In the panel (cell) producing step, the alignment layers 92 and 124 are respectively formed on the TFT array substrate 11 and the color filter substrate 12 obtained through the above-described steps. The thus-formed alignment layers 92 and 124 are subjected to alignment processing. Then, the TFT array substrate 11 and the color filter substrate 12 are bonded to each other, and liquid crystals are sealed in between the substrates.

A method for respectively forming the alignment layers 92 and 124 on the TFT array substrate 11 and the color filter substrate 12 is described below. First, an alignment material (a solution containing substances forming the alignment films) is coated on each substrate preferably by means of an alignment material coating device. For the alignment material coating device, a conventional device such as a rotary press device is preferably used. The alignment material is heated and sintered preferably by means of an alignment film sintering device. Then, the thus-sintered alignment film is subjected to alignment processing. Examples of alignment processing include a method of scratching the surface of the alignment film preferably by means of a rubbing roll, and photo-alignment processing of irradiating light energy onto the surface of the alignment film and controlling surface properties.

Then, a UV hardening sealing material and a common transfer material are coated on either of the TFT array substrate 11 and the color filter substrate 12 preferably by means of a seal patterning device. Then, spacers for keeping a uniform cell gap are applied on either of the TFT array substrate 11 and the color filter substrate 12 preferably by means of a spacer applying device. Then, liquid crystals are drop filled in the display region of either of the TFT array substrate 11 and the color filter substrate 12 preferably by means of a drop filling device. Then, the TFT array substrate 11 and the color filter substrate 12 are bonded to each other under reduced pressure, and the sealing material is subjected to UV irradiation and is hardened.

Through these steps, the liquid crystal display panel 1 is obtained. Thereafter, lighting inspection is made on the thus-obtained liquid crystal display panel 1.

Such a configuration makes it easy to specify the forming step of which element is responsible for the streaky luminance differences or color irregularities when the streaky luminance differences or color irregularities are detected in inspection after production. The detection result can be used in production process management and evaluation.

For example, it becomes easy to determine which of the TFT array substrate 11 and the color filter substrate 12 is responsible for the streaky luminance differences or color irregularities on the liquid crystal display panel. In addition, tracing extended lines of the markings on the display regional lows checking whether or not streaky luminance differences or color irregularities have occurred in the boundary between the divided exposure regions. Thus, it becomes easy to check quality of the liquid crystal display panel.

The configuration of the markings are not limited to the configuration described in the first preferred embodiment of the present invention. It is essential only that the markings allow identifying the boundary positions of the divided exposure regions of the respective elements. Thus, the configuration of the markings such as dimensions, shapes, materials and forming methods can be varied as appropriate. Hereinafter, descriptions of modified examples of the markings will be provided.

Figure 9A:
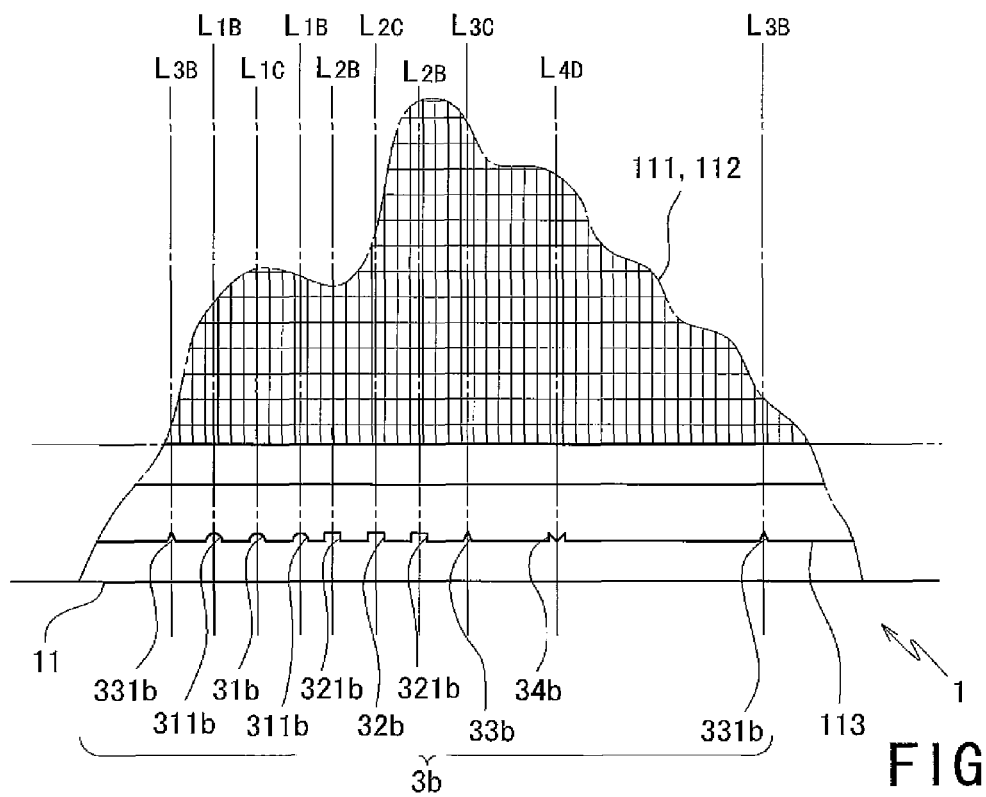
FIGS. 9A and 9B are schematic plan views showing modified examples of the markings provided to the display panel according to the first preferred embodiment of the present invention.

FIG. 9A is a view showing a first modified example of the markings, which is a schematic plan view showing markings 31b, 311b, 32b, 321b, 33b, 331b and 34b of the TFT array substrate 11 and their peripheral portion. As shown in FIG. 9A and similar to the first preferred embodiment of the present invention, the markings 31b and 311b indicating the boundary positions $L_{1C}$ and $L_{1B}$ of the divided exposure regions of the thin film transistors of the TFT array substrate, the markings 32b and 321b indicating the boundary positions $L_{2C}$ and $L_{2B}$ of the divided exposure regions of the black matrix of the color filter substrate, the markings 33b and 331b indicating the boundary positions $L_{3C}$ and $L_{3B}$ of the divided exposure regions of the alignment control structural elements, and the marking 34b indicating the boundary $L_{4D}$ between the divided exposure regions of the color layers are provided.

The markings 31b, 311b, 32b, 321b, 33b, 331b and 34b are provided in such a manner that the outline of the light shielding layer 113 formed on the TFT array substrate 11 has concave portions at the boundary positions $L_{1C}$, $L_{1B}$, $L_{2C}$, $L_{2B}$, $L_{3C}$, $L_{3B}$ and $L_{4D}$ of the divided exposure regions of the respective elements. In addition, the shapes of the markings 31b, 311b, 32b, 321b, 33b, 331b and 34b are made differ from each other as in the case of the first embodiment of the present invention.

For example, as shown in FIG. 9A, the markings 31b and 311b indicating the boundary positions $L_{1C}$ and $L_{1B}$ of the divided exposure regions of the thin film transistors of the TFT array substrate are concave portions in the shape of a semi-circle. The markings 32b and 321b indicating the boundary positions $L_{2C}$ and $L_{2B}$ of the divided exposure regions of the black matrix of the color filter substrate are concave portions in the shape of a square. The markings 33b and 331b indicating the boundary positions $L_{3C}$ and $L_{3B}$ of the divided exposure regions of the alignment control structural elements are concave portions substantially in the shape of a triangle (or in the shape of a letter V). The marking 34b indicating the boundary $L_{4D}$ between the divided exposure regions of the color layers is a concave portion substantially in the shape of a letter M.

The markings 31b, 311b, 32b, 321b, 33b, 331b and 34b having the configuration as described above can be formed only by varying the pattern for forming the light shielding layer 113 in the photomask used in the exposure step. In addition, the markings 31b, 311b, 32b, 321b, 33b, 331b and 34b have the same action and effect as the first embodiment of the present invention.

Figure 9B:
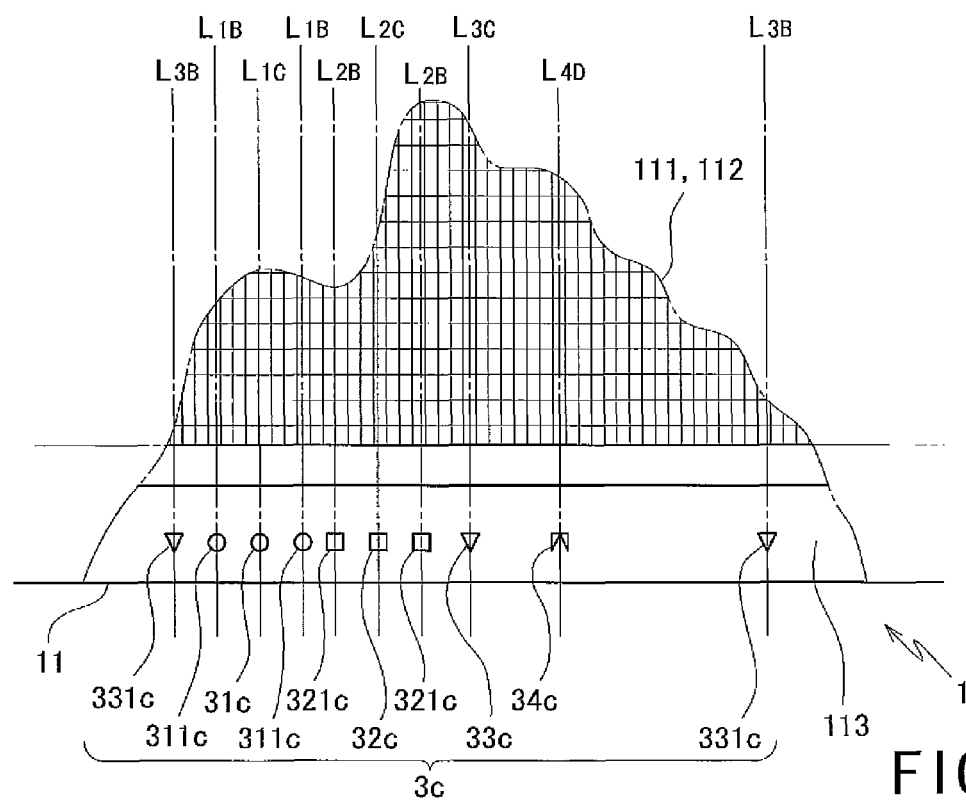

FIG. 9B is a view showing a second modified example of the markings. In this modified example, the markings are formed as independent portions. There is a case where the light shielding layer is not provided at the boundary positions of the divided exposure regions of the elements depending on the structure of the liquid crystal display panel or the TFT array substrate. In addition, there is also a case where the light shielding layer as described in the first preferred embodiment of the present invention is not included in the liquid crystal display panel. Therefore, in order that the boundary positions of the divided exposure regions of the elements may be identified even in such a liquid crystal display panel or a TFT array substrate, the markings as independent portions are preferably used.

As shown in FIG. 9B, markings 31c and 311c indicating the boundary positions $L_{1C}$ and $L_{1B}$ of the divided exposure regions of the thin film transistors of the TFT array substrate, markings 32c and 321c indicating the boundary positions $L_{2C}$ and $L_{2B}$ of the divided exposure regions of the black matrix of the color filter substrate, markings 33c and 331c indicating the boundary positions $L_{3C}$ and $L_{3B}$ of the divided exposure regions of the alignment control structural elements, and a marking 34c indicating the boundary $L_{4D}$ between the divided exposure regions of the color layers are provided as independent portions at the peripheral portion of the TFT array substrate 11.

For the markings 31c, 311c, 32c, 321c, 33c, 331c and 34c, a pattern for providing these markings is preferably formed previously on the photomask used in forming the scanning signal lines (gate signal lines) and the other elements. By the use of such a photomask, the markings are provided simultaneously with forming the scanning signal lines (gate signal lines) and the other elements.

The markings are not only provided simultaneously with forming the scanning signal lines (gate signal lines) and the other elements but also provided simultaneously with forming the other light shielding pattern or visible pattern by photolithography. In addition, the markings may be provided simultaneously with forming the data signal lines (source signal lines) and the drain lines by using the same material as them. The markings 31c, 311c, 32c, 321c, 33c, 331c and 34c having the configuration as described above can also exert the same action and effect as the first preferred embodiment of the present invention.

The configuration in which the markings as independent portions are provided may be used for the substrates in which the light shielding layer is formed on the boundary positions of the divided exposure regions of the elements. In other words, such a configuration is preferable that the markings are not provided on the light shielding layer, and the markings as independent portions are provided at positions apart from the light shielding layer. Owing to the markings having such a configuration, it is possible to form only the markings at positions where they are easy to visually observe even if the light shielding layer is provided at a position where it is difficult to visually observe from the outside. For example, if the light shielding layer is difficult to visually observe from the outside because it coincides with the other elements such as a sealing member, the markings are provided at positions where they do not coincide with the other elements.

In addition, while the markings are provided on the TFT array substrate in the first embodiment of the present invention, they may be provided on the color filter substrate. A description of providing the markings on the color filter substrate will be provided below.

Figure 10A:
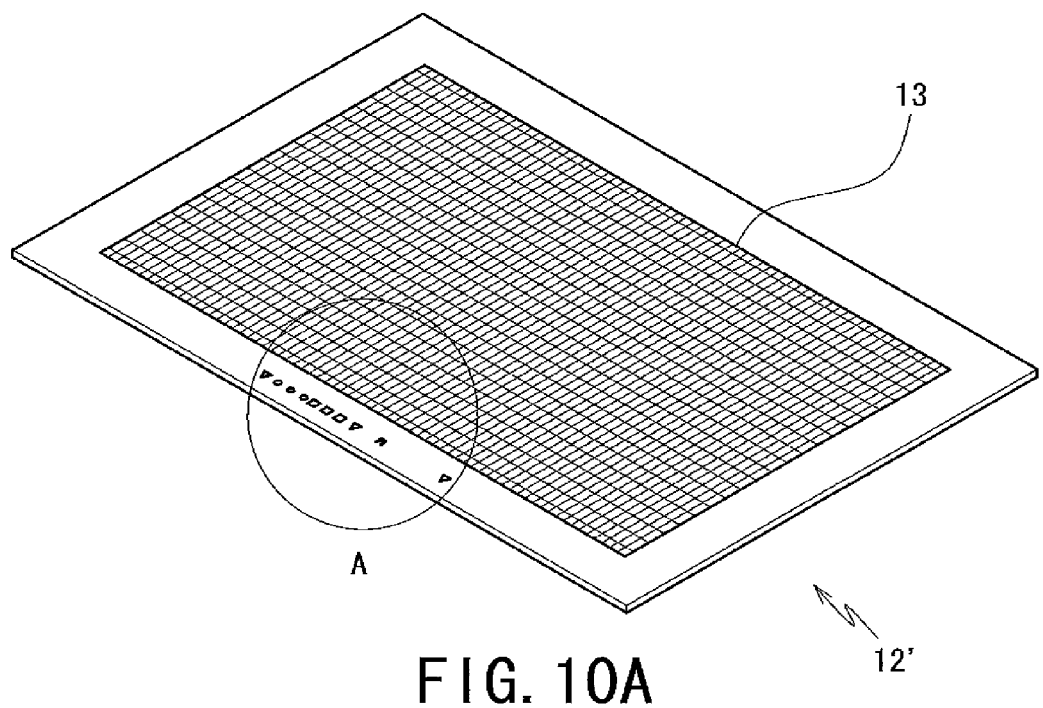
FIGS. 10A and 10B are schematic views showing a configuration of a color filter substrate on which markings are provided.
Figure 10B:
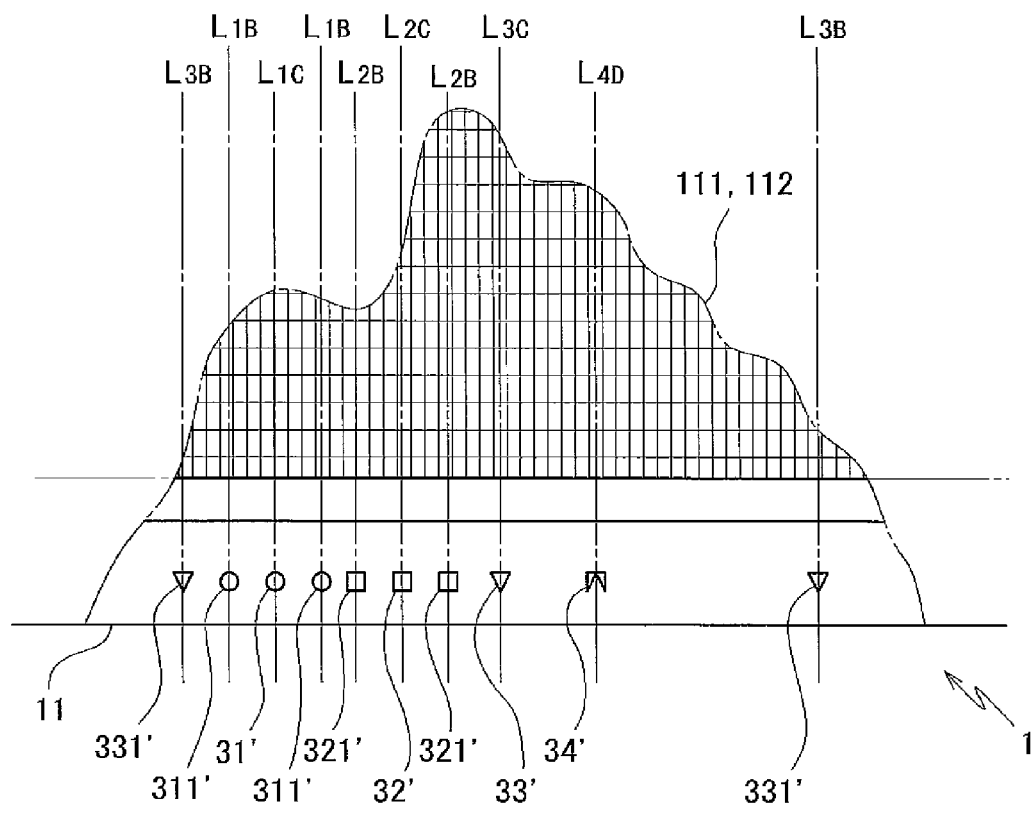

FIGS. 10A and 10B are schematic view showing a configuration of a color filter substrate on which markings are provided. FIG. 10A is an external oblique view showing the entire color filter substrate. FIG. 10B is a magnified view of a portion A shown in FIG. 10A in which the markings are provided.

A color filter substrate 12' is different from the color filter substrate 12 mainly in the presence of the markings, and other respects are the same. In other words, the color filter substrate 12' also has the display region 13 in which elements such as the black matrix and the color filters of red, green and blue colors are arranged in a matrix. Markings 31', 311', 32', 321', 33', 331' and 34' indicating the boundary positions of the divided exposure regions of the respective elements are provided outside the display region 13. Descriptions of the other elements than the markings 31', 311', 32', 321', 33', 331' and 34' are omitted.

As shown in FIGS. 10A and 10B, provided on the color filter substrate 12' are the markings 31' and 311' indicating the boundary positions $L_{1C}$ and $L_{1B}$ of the divided exposure regions of the thin film transistors of the TFT array substrate, the markings 32' and 321' indicating the boundary positions $L_{2C}$ and $L_{2B}$ of the divided exposure regions of the black matrix of the color filter substrate, the markings 33' and 331' indicating the boundary positions $L_{3C}$ and $L_{3B}$ of the divided exposure regions of the alignment control structural elements, and the marking 34' indicating the boundary $L_{4D}$ between the divided exposure regions of the color layers. The markings 31', 311', 32', 321', 33', 331' and 34' are provided outside the display region 13 at a peripheral portion of the transparent substrate 8. Especially, the markings are preferably provided at positions such that they do not coincide with the sealing member for sealing in liquid crystals.

The markings 31', 311', 32', 321', 33', 331' and 34' consist of the same material as the black matrix 121, and are formed simultaneously with forming the black matrix 121. In other words, a pattern for providing the markings is previously formed on the photomask used in forming the black matrix 121. Such a photomask allows forming the markings simultaneously with forming the black matrix 121.

The markings 31', 311', 32', 321', 33', 331' and 34' are formed into different shapes from each other so that they allow identifying the boundary positions $L_{1C}$, $L_{1B}$, $L_{2C}$, $L_{2B}$, $L_{3C}$, $L_{3B}$ and $L_{4D}$ of the divided exposure regions of the respective elements. The shapes of the markings 31', 311', 32', 321', 33', 331' and 34' in FIGS. 10A and 10B are the same as those in the second modified example of the first embodiment of the present invention. Accordingly, detailed descriptions thereof are omitted.

The thus-prepared color filter substrate 12' and the TFT array substrate are bonded to each other, a sealing member is provided so as to surround the display region, and liquid crystals are sealed in a region enclosed with the sealing member. Thus, a liquid crystal display panel according to a second embodiment of the present invention is obtained. For the TFT array substrate of the liquid crystal display panel according to the second embodiment of the present invention, the TFT array substrate of the liquid crystal display panel according to the first embodiment of the present invention on which the markings are not provided can be used. Therefore, a description of the TFT array substrate is omitted.

The markings 31', 311', 32', 321', 33', 331' and 34' are not only formed simultaneously with forming the black matrix, but also formed simultaneously with forming the color layers or the alignment control structural elements using the same material as them.

Owing to such a configuration, the same action and effect as the liquid crystal display panel according to the first embodiment of the present invention can be exerted.

While the embodiments of the present invention have been described above, it is to be understood that variations and modifications will be apparent to those skilled in the art without departing the scope and spirit of the present invention. The scope of the present invention, therefore, is to be determined solely by the following claims.

For example, the shapes of the markings are not limited to the foregoing embodiments of the present invention, and it is essential only that it be possible to distinguish between the boundary positions of the divided exposure regions of the respective elements. Examples of the markings include markings consisting of letters or symbols and markings including letters or symbols.

While the divisional exposure in which the region to be exposed is divided into two exposure regions and exposure is made on each divided exposure region is used in the embodiments of the present invention, the number of divided exposure regions is not specifically limited. In addition, the positional relation among the boundary positions of the divided exposure regions of the respective elements is not specifically limited. The elements to be provided with the markings are not limited to the elements described in the embodiments of the present invention. It is essential only that the markings be provided to elements that are to be identified.

While the descriptions of the liquid crystal display panel in which the thin film transistors and the color layers are formed on the different substrates are provided in the embodiments of the present invention, the present invention may be adopted to a liquid crystal display panel in which thin film transistors and color layers are formed on the same substrate. It is essential only that in the given pattern of the elements to be formed on each substrate of the liquid crystal display panel, the boundary positions of the divided exposure regions of the respective elements should be easily visually observed and/or identified.

In addition, while examples of the configurations and production methods of the TFT array substrate and the color filter substrate are provided in the above descriptions, the configuration and production method are not specifically limited.

What is claimed is:

1. A substrate for a display panel comprising:
   two or more thin film patterns, each of which is formed by divisional exposure by which a region to be exposed is divided into a plurality of exposure regions and exposure is made on each of the divided exposure regions;
   markings each provided to the thin film patterns, wherein the markings have shapes different from each other to distinguish between the boundary positions of the divided exposure regions of the respective thin film patterns, and wherein the markings indicate the boundary positions of the divided exposure regions of the respective thin film patterns to locate the boundary positions of the divided exposure regions of the respective thin film patterns,
   wherein, the markings for each exposure region include a center marking and edge markings, having a same shape as the center marking, provided on each side of the center marking for defining a boundary position between the edge markings, and
   wherein the boundary positions of the divided exposure regions of the two or more thin films do not coincide with each other.

2. The substrate according to claim 1, wherein the marking is provided at a boundary between the divided exposure regions and/or in the vicinity of the boundary.

3. The substrate according to claim 1, wherein the marking is provided in a light shielding thin film pattern which is provided in the vicinity of an outer rim of the thin film pattern formed by the divisional exposure.

4. The substrate according to claim 1, wherein the marking is made of a material which is the same as a material of any one of the two or more thin film patterns formed by the divisional exposure.

5. The substrate according to claim 1, wherein the thin film patterns define one of thin film transistors, a black matrix and a color filter.

6. A production method of a substrate for a display panel comprising the steps of:
   forming markings each provided to thin film patterns, wherein the markings have shapes different from each other to distinguish between boundary positions of divided exposure regions of respective thin film patterns, and wherein the markings indicate the boundary positions of the divided exposure regions of the respective thin film patterns, the markings for each exposure region include a center marking and edge markings, having a same shape as the center marking, provided on each side of the center marking for defining a boundary position between the edge markings; and
   locating the boundary positions of the divided exposure regions of the respective thin film patterns based on the markings.

7. A production method of a substrate for a display panel comprising the steps of:
   forming markings indicating boundary positions of divided exposure regions on at least one of two or more thin film patterns formed by divisional exposure by which a region to be exposed is divided into a plurality of exposure regions and exposure is made on each of the divided exposure regions, the markings each provided to the thin film patterns, wherein the markings have shapes different from each other to distinguish between the boundary positions of the divided exposure regions of the respective thin film patterns, the markings for each exposure region include a center marking and edge markings, having a same shape as the center marking, provided on each side of the center marking for defining a boundary position between the edge markings, and wherein the boundary positions of the divided exposure regions of the two or more thin film patterns do not coincide with each other; and
   locating the boundary positions of the divided exposure regions of the respective thin film patterns based on the markings.

8. A production method of a display panel comprising the steps of:
   forming markings each provided to thin film patterns, wherein the markings have shapes different from each other to distinguish between boundary positions of divided exposure regions of respective thin film patterns, wherein the markings indicate the boundary positions of the divided exposure regions of the respective thin film patterns, and wherein the markings for each exposure region include a center marking and edge markings, having a same shape as the center marking, provided on each side of the center marking for defining a boundary position between the edge markings; and
   locating the boundary positions of the divided exposure regions based on the markings.

9. A production method of a display panel comprising the steps of:
   forming markings indicating boundary positions of divided exposure regions on at least one of two or more thin film patterns formed by divisional exposure by which a region to be exposed is divided into a plurality of exposure regions and exposure is made on each of the divided exposure regions, the markings each provided to the thin film patterns, wherein the markings have shapes different from each other to distinguish between the boundary positions of the divided exposure regions of the respective thin film patterns, wherein the markings for each exposure region include a center marking and edge markings, having a same shape as the center marking, provided on each side of the center marking for defining a boundary position between the edge markings, and wherein the boundary positions of the divided exposure regions of the two or more thin film patterns do not coincide with each other; and
   locating the boundary positions of the divided exposure regions of the respective thin film patterns based on the markings.

* * * * *